(12) United States Patent
Yamaguchi et al.

(10) Patent No.: US 7,804,871 B2
(45) Date of Patent: Sep. 28, 2010

(54) SEMICONDUCTOR LASER

(75) Inventors: Tsutomu Yamaguchi, Tokyo (JP); Takehiro Nishida, Tokyo (JP); Harumi Nishiguchi, Tokyo (JP); Hitoshi Tada, Tokyo (JP); Yasuaki Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 81 days.

(21) Appl. No.: 12/179,627

(22) Filed: Jul. 25, 2008

(65) Prior Publication Data
US 2008/0310473 A1  Dec. 18, 2008

Related U.S. Application Data

(63) Continuation of application No. 11/269,627, filed on Nov. 9, 2005, now Pat. No. 7,756,180.

(30) Foreign Application Priority Data

Nov. 11, 2004 (JP) ............................. 2004-327622
Sep. 30, 2005 (JP) ............................. 2005-286328

(51) Int. Cl.
*H01S 5/00* (2006.01)
(52) U.S. Cl. ................................. 372/46.012
(58) Field of Classification Search ............. 372/46.012
See application file for complete search history.

(56) References Cited

U.S. PATENT DOCUMENTS 5,499,260 A  3/1996  Takahashi et al.
5,523,256 A  6/1996  Adachi et al.
6,414,976 B1  7/2002  Hirata
2004/0047381 A1  3/2004  Tojo et al.

(Continued)

FOREIGN PATENT DOCUMENTS

| JP | 2-264488 | 10/1990 |
|---|---|---|
| JP | 03085785 A | * 4/1991 |
| JP | 8-83953 | 3/1996 |
| JP | 2003-31909 | 1/2003 |
| JP | 2003-60308 | 2/2003 |

OTHER PUBLICATIONS

Yoshida, Yasuaki et al., "Vertical beam quality of 660 nm AlGaInP laser diodes with asymmetric cladding layer", High Frequency & Optical Semiconductor Div., Mitsubishi Electric Corporation, pp. 39-40 (2003).

*Primary Examiner*—Minsun Harvey
*Assistant Examiner*—Joshua King
(74) *Attorney, Agent, or Firm*—Leydig, Voit & Mayer, Ltd.

(57) ABSTRACT

A semiconductor laser is provided which emits laser light in which the intensity center of the far-field pattern in the horizontal direction does not vary with variation of the optical output and in which the shape of the far-field pattern in the horizontal direction is stable. The width of trenches is determined so that the magnitude (E1) of the electric field at the center of a ridge and the magnitude (E2) of the electric field at the edges of the trenches provide a ratio E1/E2 that is larger than 0.0001 and smaller than 0.01. In a semiconductor laser with a double-channel ridge structure, layers having a larger equivalent refractive index than the trenches exist outside the trenches. Accordingly, the semiconductor absorbs the light distributed outside the trenches and it is possible to obtain laser light in which the intensity center of the far-field pattern in the horizontal direction does not vary with variation of the optical output and in which the shape of the far-field pattern in the horizontal direction is stable.

9 Claims, 6 Drawing Sheets

U.S. PATENT DOCUMENTS

2004/0159836 A1 8/2004 Sugimoto et al.
2004/0159848 A1 8/2004 Yamaguchi et al.
2005/0047464 A1 3/2005 Shigihara et al.
2006/0007976 A1 1/2006 Watanabe et al.

* cited by examiner

F I G . 1
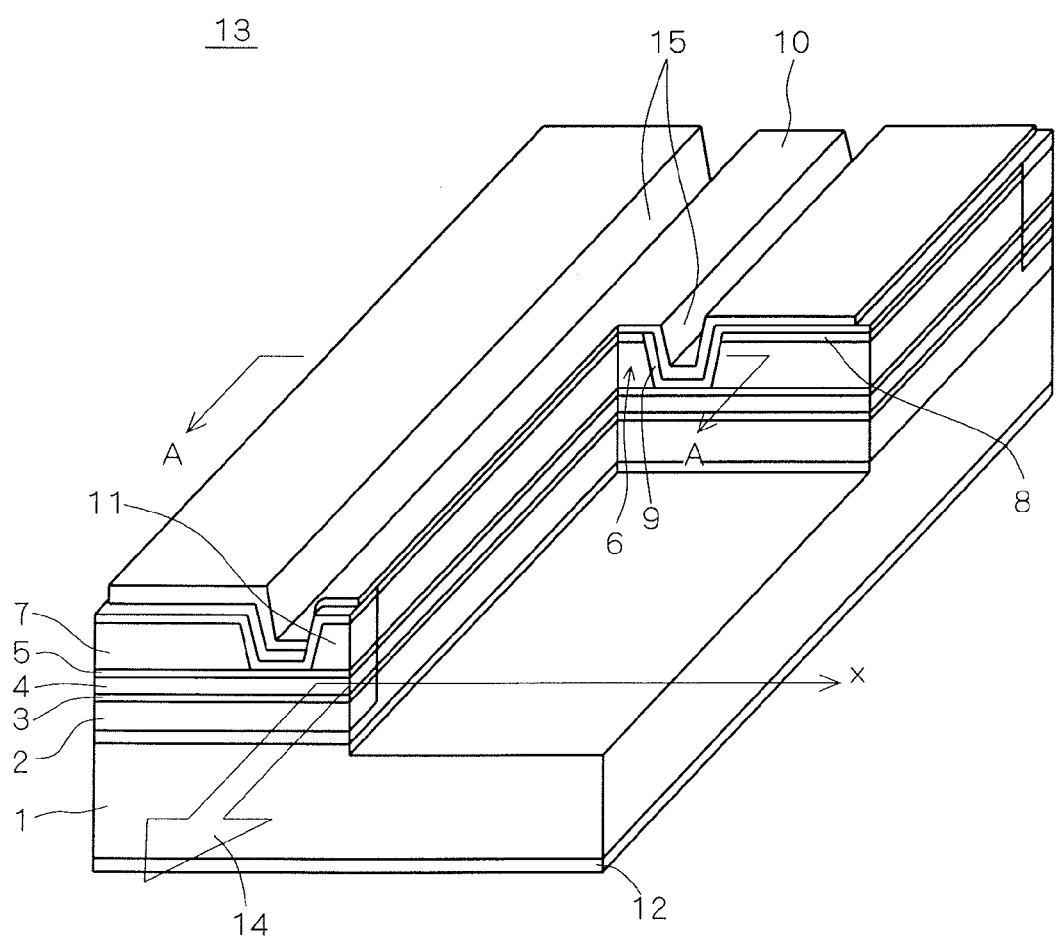

FIG. 4
| STRUCTURAL PARAMETERS | | | | DISTANCES "X" THAT PROVIDE THE RATIOS BELOW WITH ELECTRIC FIELD AT CENTER OF RIDGE | | |
|---|---|---|---|---|---|---|
| $\lambda$ (μm) | $n_1$ | $\Delta n$ | T (μm) | 1% | 0.1% | 0.01% |
| 0.660 | 3.2 | 0.004 | 1.4 | 4.7 | 6.9 | 9.1 |
| 0.660 | 3.2 | 0.004 | 2.2 | 4.3 | 6.2 | 8.0 |
| 0.405 | 2.5 | 0.004 | 2.0 | 3.0 | 4.2 | 5.4 |
| 0.405 | 2.5 | 0.010 | 2.0 | 2.1 | 2.8 | 3.5 |
| 0.405 | 2.5 | 0.020 | 2.0 | 1.7 | 2.2 | 2.7 |
| 0.780 | 3.2 | 0.004 | 2.2 | 5.2 | 7.5 | 9.8 |
FIG. 5
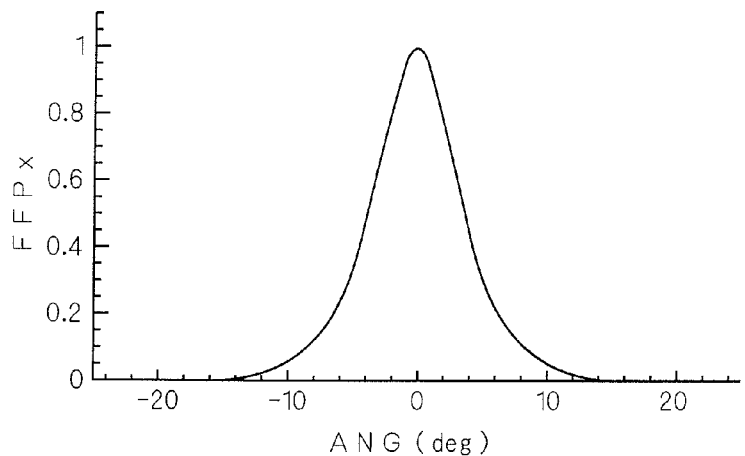
FIG. 6
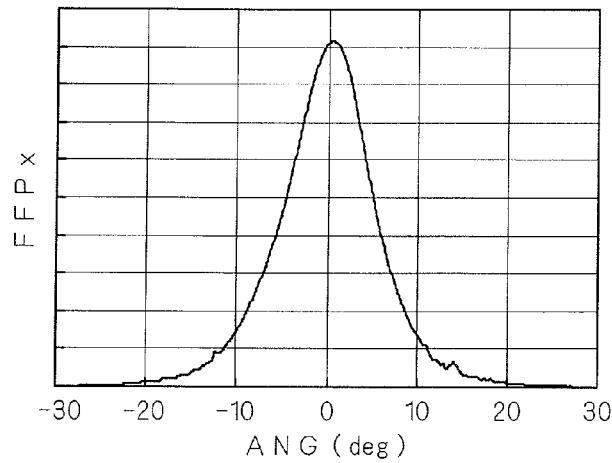

F I G . 1 0
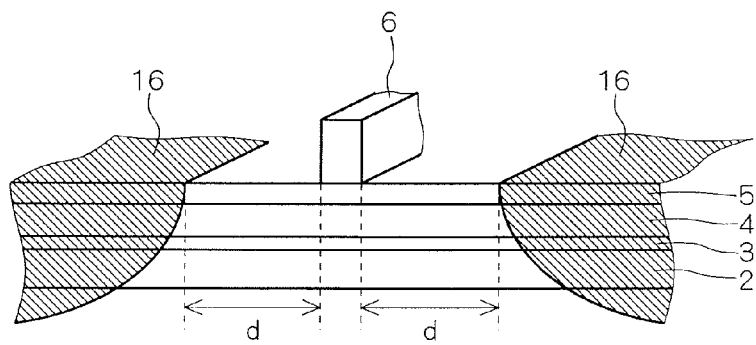
F I G . 1 1
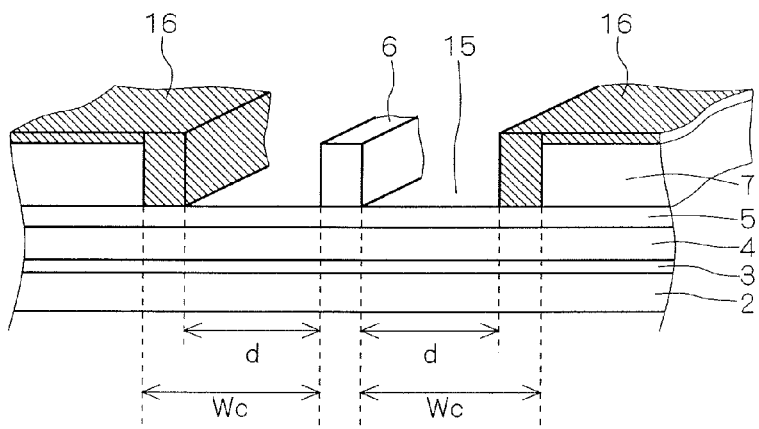
F I G . 1 2
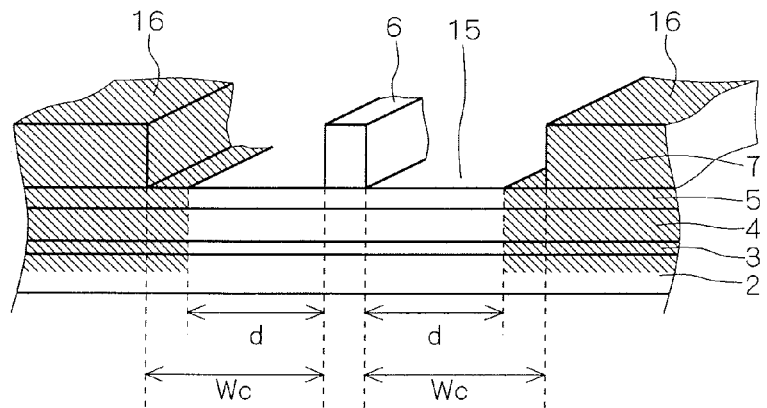

F I G . 1 3
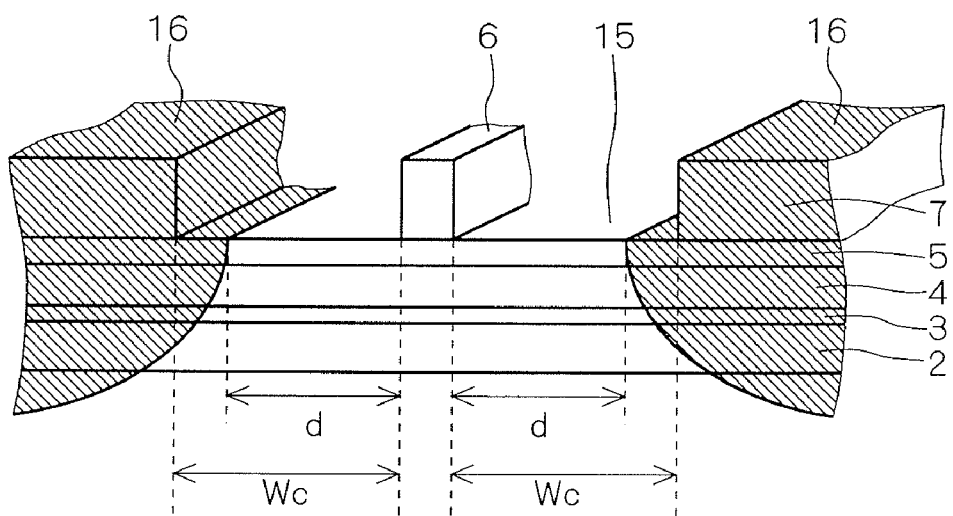

SEMICONDUCTOR LASER

BACKGROUND OF THE INVENTION

1. Field of the Invention

The present invention relates to a semiconductor laser used in an optical disk system, optical communication, and the like, and particularly to a ridge-structure-type, discrete and monolithic semiconductor laser.

2. Description of the Background Art

In a semiconductor laser with a double-channel ridge structure, a ridge is formed between channels (trenches) having a small equivalent refractive index, and the channels are formed between layers having a large equivalent refractive index.

In such a conventional double-channel ridge structure semiconductor laser, the trenches on the sides of the ridge have a width of 10 μm, and the trenches are formed by removing semiconductor film by dry-etching and wet-etching.

The laser light emitted from the semiconductor laser thus constructed exhibits an oval far-field pattern, where the expansion of the far-field pattern is large in the direction normal to the active layer and the expansion of the far-field pattern is small in the direction horizontal to the active layer.

Conventional double-channel ridge structure semiconductor lasers have a problem that their yields are unsteady because the intensity center and shape of the far-field pattern in the horizontal direction tend to fluctuate with variation of the optical output.

SUMMARY OF THE INVENTION

An object of the present invention is to provide a semiconductor laser that emits laser light in which the intensity center of the far-field pattern in the horizontal direction does not vary with variation of the optical output and in which the shape of the far-field pattern in the horizontal direction is stable.

According to a first aspect of the present invention, in a semiconductor laser having a double-channel ridge structure, a ridge is formed between channels having a smaller equivalent refractive index than the ridge, and the channels are formed between layers having a larger equivalent refractive index than the channels.

Where, when $$E = A \cos(ux) \quad (x \leq T/2) \quad (1)$$

$$E = A \cos(uT/2) \exp(-w(|x|-T/2)) \quad (x \geq T/2) \quad (2)$$

$$u^2 + w^2 = (n_1^2 - n_2^2)(2\pi/\lambda)^2 T^2 \quad (3)$$

$$w = u \tan(u) \quad (4)$$

where
- E is an electric field,
- A is a given coefficient,
- x is a distance from the center of the ridge,
- T is the width of the ridge,
- $n_1$ is the equivalent refractive index of the ridge,
- $n_2$ is the equivalent refractive index of the channels,
- λ is the oscillation wavelength of the semiconductor laser, and
- Wc is the width of the channels, then, the width of the channels is determined so that an electric field E1 calculated from Expressions (1) to (4) with x=0 and an electric field E2 calculated with x=T/2+Wc provide a ratio E2/E1 that satisfies $$0.0001 \leq E2/E1 \leq 0.01 \quad (5).$$

According to the invention, the width of the channels is determined to satisfy Expression (5). Then, layers having an equivalent refractive index larger than that of the channels exist outside the channels. Accordingly, with Expression (5) being satisfied, the semiconductor absorbs the light distributed outside the channels, and it is thus possible to obtain laser light in which the intensity center of the far-field pattern in the horizontal direction does not vary with variation of the optical output and in which the shape of the far-field pattern in the horizontal direction is stable.

According to a second aspect of the present invention, in a semiconductor laser having a ridge structure, a ridge is formed between channels having a smaller equivalent refractive index than the ridge.

Laser light absorbing regions that absorb the laser light are arranged on both sides of the ridge at given intervals from the edges of the ridge.

According to the invention, the laser light absorbing regions are arranged at given intervals from the edges of the ridge. Accordingly, the laser light absorbing regions absorb light distributed outside the channels, and it is therefore possible to obtain laser light in which the intensity center of the far-field pattern in the horizontal direction does not vary with variation of the optical output and in which the shape of the far-field pattern in the horizontal direction is stable.

According to a third aspect of the invention, in a semiconductor laser having a double-channel ridge structure, a ridge is formed between channels having a smaller equivalent refractive index than the ridge, and the channels are formed between layers having a larger equivalent refractive index than the channels.

The semiconductor laser has an oscillation wavelength in the range of not less than 601 nm nor more than 700 nm, and the channels in the double-channel ridge structure have a width larger than 5 μm and smaller than 10 μm.

According to the invention, in a semiconductor laser having an oscillation wavelength in the range of not less than 601 nm nor more than 700 nm, the semiconductor absorbs the light distributed outside the channels and it is thus possible to obtain laser light in which the intensity center of the far-field pattern in the horizontal direction does not vary with variation of the optical output and in which the shape of the far-field pattern in the horizontal direction is stable.

According to a fourth aspect of the invention, in a semiconductor laser having a double-channel ridge structure, a ridge is formed between channels having a smaller equivalent refractive index than the ridge, and the channels are formed between layers having a larger equivalent refractive index than the channels.

The semiconductor laser has an oscillation wavelength in the range of not less than 701 nm nor more than 900 nm, and the channels in the double-channel ridge structure have a width larger than 5 μm and smaller than 10 μm.

According to the invention, in a semiconductor laser having an oscillation wavelength in the range of not less than 701 nm nor more than 900 nm, the semiconductor absorbs the light distributed outside the channels and it is thus possible to obtain laser light in which the intensity center of the far-field pattern in the horizontal direction does not vary with variation of the optical output and in which the shape of the far-field pattern in the horizontal direction is stable.

According to a fifth aspect of the invention, in a semiconductor laser having a double-channel ridge structure, a ridge is formed between channels having a smaller equivalent refractive index than the ridge, and the channels are formed between layers having a larger equivalent refractive index than the channels.

The semiconductor laser has an oscillation wavelength in the range of not less than 330 nm nor more than 600 nm, and the channels in the double-channel ridge structure have a width of not less than 0.7 μm nor more than 5.0 μm.

According to the invention, in a semiconductor laser having an oscillation wavelength in the range of not less than 330 nm nor more than 600 nm, the semiconductor absorbs the light distributed outside the channels and it is thus possible to obtain laser light in which the intensity center of the far-field pattern in the horizontal direction does not vary with variation of the optical output and in which the shape of the far-field pattern in the horizontal direction is stable.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view illustrating the structure of a semiconductor laser according to a first preferred embodiment;

FIG. 4 is a diagram showing distances at which the magnitude of the electric field at the center of the ridge and the magnitude of the electric field at the edges of the trenches form given ratios, with different sets of structural parameters of the semiconductor laser according to the first preferred embodiment;

FIG. 5 is a diagram showing the results of calculation of the far-field pattern in the horizontal direction in the semiconductor laser of the first preferred embodiment;

FIG. 6 is a diagram showing actually measured values of the far-field pattern in the horizontal direction in the semiconductor laser of the first preferred embodiment;

FIG. 10 is a perspective view illustrating the structure of a semiconductor laser according to a fourth preferred embodiment;

FIG. 11 is a perspective view illustrating the structure of a semiconductor laser according to an eighth preferred embodiment;

FIG. 12 is a perspective view illustrating the structure of a semiconductor laser according to a ninth preferred embodiment; and FIG. 13 is a perspective view illustrating the structure of a semiconductor laser according to a tenth preferred embodiment.

DESCRIPTION OF THE PREFERRED EMBODIMENTS

First Preferred Embodiment

Figure 2:
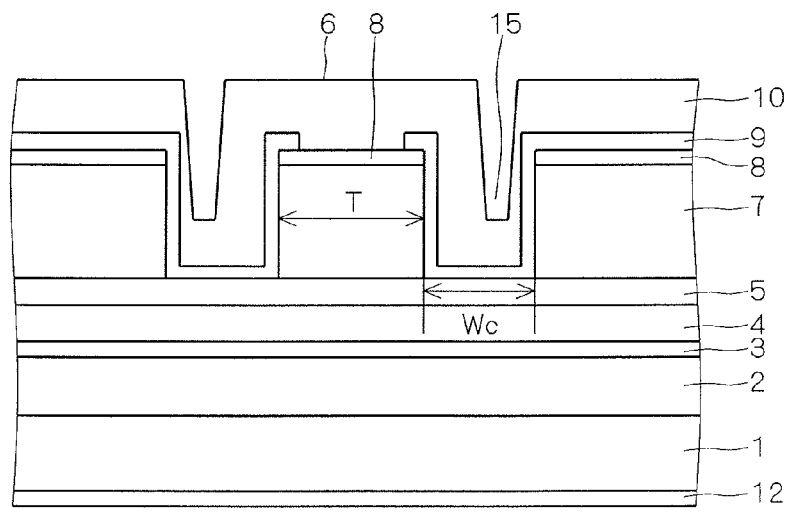
FIG. 2 is a cross-sectional view taken along line A-A of the semiconductor laser according to the first preferred embodiment.

FIG. 1 is a perspective view illustrating the structure of a semiconductor laser 13 according to a first preferred embodiment. The semiconductor laser 13 has an oscillation wavelength in the range of not less than 601 nm nor more than 700 nm. FIG. 2 is a cross-sectional view taken along line A-A in FIG. 1.

The semiconductor laser of this preferred embodiment is a semiconductor laser having a double-channel ridge structure, where two trenches (channels) 15 are formed on both sides of a ridge 6.

In FIG. 1, an n-AlGaInP lower cladding layer 2 is formed on an n-type (n-)GaAs substrate 1. An active layer 3 is formed on the n-AlGaInP lower cladding layer 2, and the active layer 3 has a multiple quantum well structure including GaInP well layers and AlGaInP barrier layers (hereinafter referred to as an MQW active layer).

On the active layer 3, a p-type (p-)AlGaInP first upper cladding layer 4 and an etching stopper layer 5 are formed sequentially. The ridge 6 is linearly formed on the etching stopper layer 5. P-AlGaInP second upper cladding layers 7 are linearly formed along the ridge 6, with the two trenches 15 lying on both sides of the ridge 6.

P-GaAs contact layers 8 are formed on the top surfaces of the ridge 6 and the p-AlGaInP second upper cladding layers 7, and an insulating film 9 is formed thereon. A p-electrode 10, made of thin metal film and gold plating, is formed on the insulating film 9. The insulating film 9 has an opening on the ridge 6 so that the p-electrode 10 and the p-GaAs contact layer 8 are electrically connected to each other.

A window region 11 is provided in the vicinity of a facet of the semiconductor laser 13. An n-electrode 12 is formed on the back of the n-GaAs substrate 1. The reference numeral 14 shows laser light.

In the example above, strictly, the composition of AlGaInP is represented as $(Al_xGa_{1-x})0.5In0.5P$. The composition ratio, x, of the n-AlGaInP lower cladding layer 2 is 0.5 to 0.7, the composition ratio x of the p-AlGaInP first upper cladding layer 4 is 0.5 to 0.7, and the composition ratio x of the p-AlGaInP second upper cladding layers 7 is 0.5 to 0.7.

The n-AlGaInP lower cladding layer 2 has a thickness of 1.5 to 4 μm, the p-AlGaInP first upper cladding layer 4 has a thickness of 0.1 to 1 μm, and the p-AlGaInP second upper cladding layers 7 have a thickness of 0.5 to 2 μm. The n-AlGaInP lower cladding layer 2 has a carrier concentration of 0.3 to $2.0 \times 10^{18}$ cm$^{-3}$, the p-AlGaInP first upper cladding layer 4 has a carrier concentration of 0.3 to $2.0 \times 10^{18}$ cm$^{-3}$, and the p-AlGaInP second upper cladding layers 7 have a carrier concentration of 0.3 to $2.0 \times 10^{18}$ cm$^{-3}$.

Next, a method of manufacturing the semiconductor laser of this preferred embodiment will be described. First, the n-AlGaInP lower cladding layer 2, MQW active layer 3, p-AlGaInP first upper cladding layer 4, etching stopper layer 5, p-AlGaInP second upper cladding layer 7, and p-GaAs contact layer 8 are sequentially formed over the n-GaAs substrate 1 by crystal growth, such as MOCVD.

Next, the window region 11 is formed in the vicinity of the facet by disordering the MQW active layer 3, e.g., by Zn diffusion. Subsequently, using resist or insulating film as a mask, the p-AlGaInP second upper cladding layer 7 is selectively etched by dry-etching and with sulfuric or hydrochloric etching solution, so as to form the ridge 6 and the trenches 15. In this process, proper etching solution, such as sulfuric acid, is used so that the etching automatically stops at the etching stopper layer 5.

Next, the insulating film 9, e.g., a nitride film, is formed all over the surface, and an opening is formed by photolithography on the top surface of the ridge 6. Then, the p-electrode 10 of thin metal film and gold plating is formed.

Figure 3:
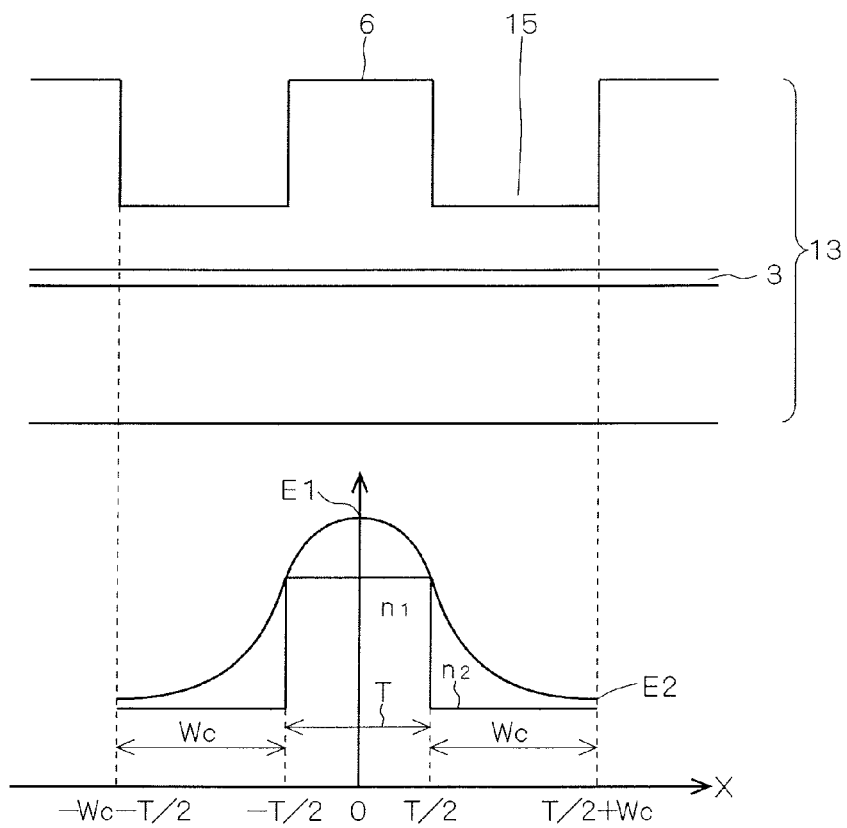
FIG. 3 is a diagram showing the electric field distribution in the cross section of the semiconductor laser according to the first preferred embodiment.

FIG. 3 shows a schematic of the structure of FIG. 2 and the refractive index distribution and electric field distribution in the structure. The upper half of FIG. 3 shows a schematic of the structure of FIG. 2. The lower half of FIG. 3 shows the refractive index distribution and electric field distribution corresponding to the schematic of the upper half.

In FIG. 3, the horizontal axis, x, shows the distances from the center of the ridge 6. The character $n_1$ shows the equivalent refractive index of the ridge 6 and $n_2$ shows the equivalent refractive index of the trenches 15. The character T shows the width of the ridge 6 and Wc shows the widths of the trenches 15.

When the refractive index distribution shown in FIG. 3 is approximated as a lossless three-layer waveguide, the electric field distribution (E) of the basic mode is generally given by Expressions (1) and (2) below (see Yasuharu Suematsu, "Semiconductor Laser and Optical Integrated Circuit", Ohmsha, Chapter 3.2, pp. 54-55).

$$E = A\cos(ux)(x \leq T/2) \quad (1)$$

$$E = A\cos(uT/2)\exp(-w(|x|-T/2))(x \geq T/2) \quad (2)$$

Where u and w are values defined by Expressions (3) and (4) below.

$$u^2 + w^2 = (n_1^2 - n_2^2)(2\pi/\lambda)^2 T^2 \quad (3)$$

$$w = u\tan(u) \quad (4)$$

Where A is a given coefficient and λ is the oscillation wavelength of the laser light.

With the semiconductor laser of the preferred embodiment, structural parameters are determined to satisfy Expression (5) below, with the magnitude (E1) of the electric field at the center of the ridge 6 and the magnitude (E2) of the electric field at an end of the trench 15 separated by a distance T/2+Wc away from the center of the ridge 6 that are obtained when a lossless three-layer waveguide approximation is applied to the double-channel ridge structure semiconductor laser.

$$0.0001 \leq E2/E1 \leq 0.01 \quad (5)$$

FIG. 4 shows calculated values of the distance x from the center of the ridge 6 that satisfy the range of the electric field ratio shown by Expression (5). When E2/E1 meets Expression (5), it is possible to obtain laser light in which the intensity center of the far-field pattern in the horizontal direction does not vary with variation of the optical output and in which the shape of the far-field pattern in the horizontal direction is stable. In FIG. 4, Δn shows values of $n_1 - n_2$.

As for the width Wc of the trenches 15 that satisfies Expression (5) in each wavelength range, with a semiconductor laser having an oscillation wavelength of not less than 601 nm nor more than 700 nm, the range of 5 µm<Wc<10 µm is preferable, 4.3 µm≦Wc≦9.0 µm is more preferable, and 4.7 µm≦Wc≦8.0 µm is still more preferable. With a semiconductor laser having an oscillation wavelength of not less than 701 nm nor more than 900 nm, the range of 5 µm<Wc<10 µm is preferable, and 5.2 µm≦Wc≦9.8 µm is more preferable. With a semiconductor laser having an oscillation wavelength of not less than 330 nm nor more than 600 nm, the range of 0.7 µm≦Wc≦5.0 µm is preferable, 1.7 µm≦Wc≦5.0 µm is more preferable, and 2.2 µm≦Wc≦4.2 µm is still more preferable.

Figure 7:
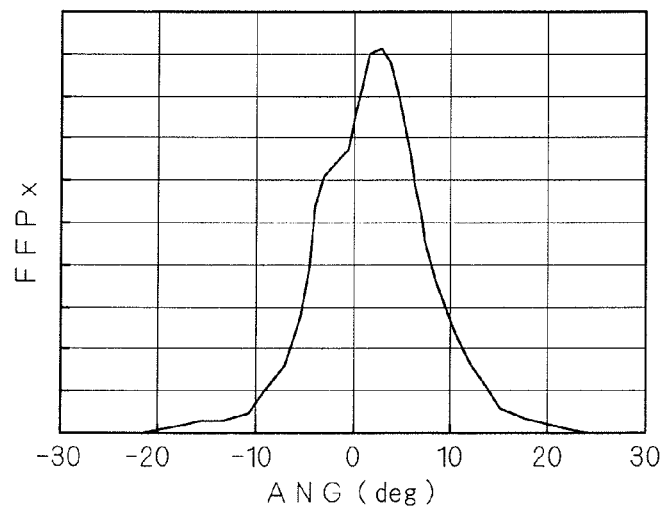
FIG. 7 is a diagram showing actually measured values of the far-field pattern in the horizontal direction in a conventional semiconductor laser.

FIG. 5 shows calculated results of simulation of the far-field pattern (FFPx) in the horizontal direction with a semiconductor laser having an oscillation wavelength of not less than 601 nm nor more than 700 nm and having a width Wc of the trenches 15 equal to 7 µm. FIG. 6 shows an example of the far-field pattern in the horizontal direction of an actually fabricated semiconductor laser. FIG. 7 shows an example of the far-field pattern of a conventional semiconductor laser having an oscillation wavelength of not less than 601 nm nor more than 700 nm and a width Wc of the trenches 15 equal to 10 µm.

It is known from FIGS. 5 to 7 that designing the width of the trenches 15 within the range shown in the preferred embodiment clearly improves the shape of the far-field pattern in the horizontal direction and considerably stabilizes the center of the far-field pattern, as compared with the conventional one.

As described so far, according to the semiconductor laser of the preferred embodiment, the width of the trenches 15 is set to satisfy Expression (5). In a double-channel ridge structure semiconductor laser like the semiconductor laser of the preferred embodiment, layers having a larger equivalent refractive index than the trenches 15 exist outside the trenches 15.

Accordingly, with Expression (5) being satisfied, the semiconductor absorbs the light distributed outside the trenches 15, and it is thus possible to obtain laser light in which the intensity center of the far-field pattern in the horizontal direction does not vary with variation of the optical output and in which the shape of the far-field pattern in the horizontal direction is stable.

Also, because the amount of absorption of the light distributed outside the trenches 15 is small, other laser characteristics are not deteriorated.

While this preferred embodiment has shown a semiconductor laser having an oscillation wavelength in the range of not less than 601 nm nor more than 700 nm, the same applies also to semiconductor lasers of other oscillation wavelengths, as long as the light distribution satisfies Expression (5). Also, the shapes of the ridge 6 and the trenches 15 are just illustrative and not restrictive, and they can be shaped vertically or in inclined shape.

In such cases, too, the semiconductor absorbs the light distributed outside the trenches 15, making it possible to obtain laser light in which the intensity center of the far-field pattern in the horizontal direction does not vary with variation of the optical output and the shape of the far-field pattern in the horizontal direction is stable.

Second Preferred Embodiment

Figure 8:
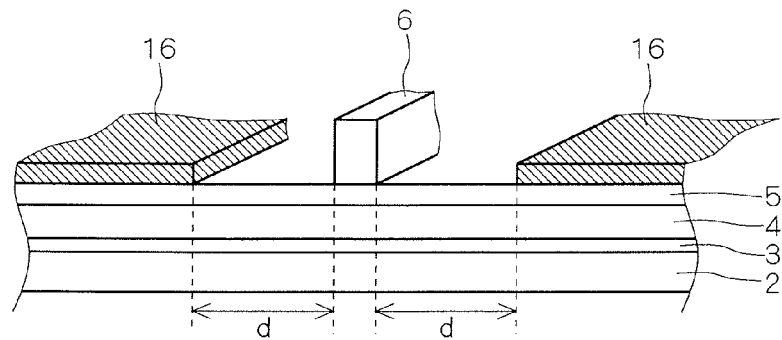
FIG. 8 is a perspective view illustrating the structure of a semiconductor laser according to a second preferred embodiment.

FIG. 8 is a perspective view of a cross section of a semiconductor laser according to a second preferred embodiment. The semiconductor laser of this preferred embodiment has an oscillation wavelength in the range of not less than 601 nm nor more than 700 nm, and has a ridge structure without double channels, unlike the semiconductor laser shown in FIG. 1. The same reference characters as those of FIGS. 1 and 2 indicate the same or corresponding parts. FIG. 8 does not show components that are not closely related to the description of the preferred embodiment, such as the p-electrode 10.

In the semiconductor laser of this preferred embodiment, amorphous silicon layers are disposed as laser light absorbing regions 16 at intervals d, longer than 5 µm and shorter than 10 µm, from the edges of the ridge 6.

The light distributed in the laser light absorbing regions is absorbed by the amorphous silicon, which makes it possible to fabricate a device whose radiated beam shape in the horizontal direction remains stable as the optical output varies and whose beam center in the horizontal direction does not vary with variation of the optical output.

Third Preferred Embodiment

Figure 9:
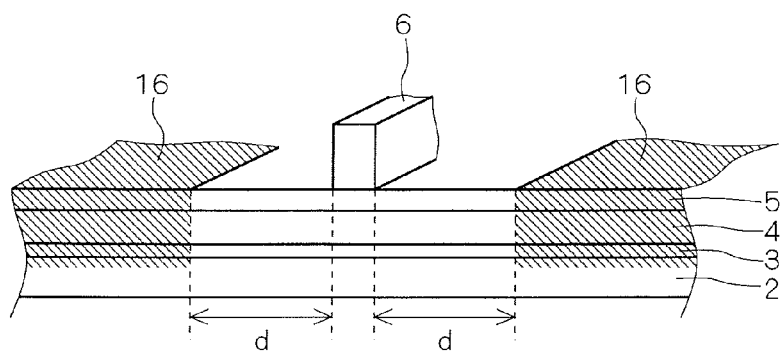
FIG. 9 is a perspective view illustrating the structure of a semiconductor laser according to a third preferred embodiment.

FIG. 9 is a perspective view of a cross section of a semiconductor laser according to a third preferred embodiment.

The semiconductor laser of this preferred embodiment has an oscillation wavelength in the range of not less than 601 nm nor more than 700 nm, and has a ridge structure without double channels, unlike the semiconductor laser shown in FIG. 1.

As the laser light absorbing regions 16, proton-(ion-)implanted regions are disposed at intervals d longer than 5 μm and shorter than 10 μm on both sides of the ridge 6. The proton-implanted regions are non-gain regions and therefore function as the laser light absorbing regions.

The light distributed in the laser light absorbing regions is thus absorbed, which makes it possible to fabricate a device whose radiated beam shape in the horizontal direction remains stable as the optical output varies and whose beam center in the horizontal direction does not vary with variation of the optical output.

Fourth Preferred Embodiment

FIG. 10 is a perspective view of a cross section of a semiconductor laser according to a fourth preferred embodiment. The semiconductor laser of this preferred embodiment has an oscillation wavelength in the range of not less than 601 nm nor more than 700 nm, and has a ridge structure without double channels, unlike the semiconductor laser shown in FIG. 1.

In the semiconductor laser of this preferred embodiment, as the laser light absorbing regions 16, regions with a high impurity concentration of $1 \times 10^{18}$ cm$^{-3}$ or more are formed by Zn diffusion at intervals d longer than 5 μm and shorter than 10 μm on both sides of the ridge 6.

The light distributed in the laser light absorbing regions is absorbed by free carriers in the high impurity concentration regions, which makes it possible to fabricate a device whose radiated beam shape in the horizontal direction remains stable as the optical output varies and whose beam center in the horizontal direction does not vary with variation of the optical output.

Fifth Preferred Embodiment

According to a fifth preferred embodiment, in a semiconductor laser constructed as shown in the second to fourth preferred embodiments and having an oscillation wavelength of not less than 701 nm nor more than 900 nm, the laser light absorbing regions 16 are disposed at intervals d longer than 5 μm and shorter than 10 μm from the edges of the ridge 6.

Also with the semiconductor laser having an oscillation wavelength in the range of not less than 701 nm nor more than 900 nm, the arrangement of the laser light absorbing regions 16 as described above makes it possible to obtain a semiconductor laser whose radiated beam shape in the horizontal direction remains stable as the optical output varies and whose beam center in the horizontal direction does not vary with variation of the optical output.

Sixth Preferred Embodiment

According to a sixth preferred embodiment, in a semiconductor laser constructed as shown in the second to fourth preferred embodiments and having an oscillation wavelength in the range of not less than 330 nm nor more than 600 nm, the laser light absorbing regions 16 are disposed at intervals d of not less than 0.7 μm nor more than 5.0 μm from the edges of the ridge 6.

In the semiconductor laser of this preferred embodiment, the substrate 1 is made of n-type GaN, the lower cladding layer 2 is made of n-type AlGaN, the active layer 3 is made of an InGaN multiple quantum well layer, the first upper cladding layer is made of p-type $Al_XGa_{1-X}N$, the second upper cladding layer is made of p-type $Al_YGa_{1-Y}N$, and the contact layer is made of p-type GaN.

Also with the semiconductor laser having an oscillation wavelength in the range of not less than 330 nm nor more than 600 nm, the arrangement of the laser light absorbing regions as described above makes it possible to obtain a semiconductor laser whose radiated beam shape in the horizontal direction remains stable as the optical output varies and whose beam center in the horizontal direction does not vary with variation of the optical output.

Seventh Preferred Embodiment

According to a seventh preferred embodiment, in the semiconductor lasers of the second to sixth preferred embodiments, the laser light absorbing regions 16 are formed only in the facet portion of the chip, including the window region 11 (see FIG. 1).

This reduces the costs for the formation of the laser light absorbing regions 16.

Eighth Preferred Embodiment

FIG. 11 is a perspective view of a cross section of a semiconductor laser according to an eighth preferred embodiment. The semiconductor laser has the double-channel ridge structure as shown in FIG. 1 and its oscillation wavelength is in the range of not less than 601 nm nor more than 700 nm.

In FIG. 11, the same reference characters as those of FIGS. 1 and 2 indicate the same or corresponding parts. In the ridge-structure semiconductor laser in which the width Wc of the trenches 15 is 10 μm or more, amorphous silicon layers are formed as the laser light absorbing regions 16 at intervals d longer than 5 μm and shorter than 10 μm on both sides of the ridge 6.

The light distributed in the laser light absorbing regions 16 is thus absorbed, which makes it possible to fabricate a semiconductor laser whose radiated beam shape in the horizontal direction remains stable as the optical output varies and whose beam center in the horizontal direction does not vary with variation of the optical output.

Ninth Preferred Embodiment

FIG. 12 is a perspective view of a cross section of a semiconductor laser according to a ninth preferred embodiment. The semiconductor laser has the double-channel ridge structure as shown in FIG. 1 and its oscillation wavelength is in the range of not less than 601 nm nor more than 700 nm.

In the ridge-structure semiconductor laser in which the width Wc of the trenches 15 is 10 μm or more, proton-implanted regions are formed as the laser light absorbing regions 16 at intervals d longer than 5 μm and shorter than 10 μm on both sides of the ridge 6. The proton-implanted regions are non-gain regions and therefore function as the laser light absorbing regions 16.

The light distributed in the laser light absorbing regions 16 is thus absorbed, which makes it possible to fabricate a device whose radiated beam shape in the horizontal direction remains stable as the optical output varies and whose beam center in the horizontal direction does not vary with variation of the optical output.

Tenth Preferred Embodiment

FIG. 13 is a perspective view of a cross section of a semiconductor laser according to a tenth preferred embodiment. The semiconductor laser of this preferred embodiment has the double-channel ridge structure as shown in FIG. 1 and its oscillation wavelength is in the range of not less than 601 nm nor more than 700 nm.

According to this preferred embodiment, in the ridge-structure semiconductor laser in which the width Wc of the trenches 15 is 10 μm or more, regions having a high impurity concentration of $1\times10^{18}$ cm$^{-3}$ or more are formed by Zn diffusion as the laser light absorbing regions 16 at intervals d longer than 5 μm and shorter than 10 μm on both sides of the ridge 6.

The light distributed in the laser light absorbing regions 16 is absorbed by free carriers in the Zn-diffused regions, which makes it possible to obtain a semiconductor laser whose radiated beam shape in the horizontal direction remains stable as the optical output varies and whose beam center in the horizontal direction does not vary with variation of the optical output.

Eleventh Preferred Embodiment

According to an eleventh preferred embodiment, in a semiconductor laser constructed as shown in the eighth to tenth preferred embodiments and having an oscillation wavelength of not less than 701 nm nor more than 900 nm, the laser light absorbing regions 16 are disposed at intervals d longer than 5 μm and shorter than 10 μm from the edges of the ridge 6.

This structure makes it possible to fabricate a device whose radiated beam shape in the horizontal direction remains stable as the optical output varies and whose beam center in the horizontal direction does not vary with variation of the optical output.

Twelfth Preferred Embodiment

According to a twelfth preferred embodiment, in a semiconductor laser constructed as shown in the eighth to tenth preferred embodiments and having an oscillation wavelength of not less than 330 nm nor more than 600 nm, the laser light absorbing regions 16 are disposed at intervals d of not less than 0.7 μm nor more than 5.0 μm from the edges of the ridge 6.

This makes it possible to obtain a semiconductor laser whose radiated beam shape in the horizontal direction remains stable as the optical output varies and whose beam center in the horizontal direction does not vary with variation of the optical output.

Thirteenth Preferred Embodiment

According to a thirteenth preferred embodiment, in the semiconductor lasers of the eighth to twelfth preferred embodiments, the laser light absorbing regions 16 are formed only in the facet portion of the chip, including the window region 11 (see FIG. 1).

This reduces the manufacturing costs.

While the invention has been described in detail, the foregoing description is in all aspects illustrative and not restrictive. It is understood that numerous other modifications and variations can be devised without departing from the scope of the invention.

What is claimed is:

1. A semiconductor laser comprising:
   a ridge having an equivalent refractive index, n1; and
   first and second laser light absorbing regions that absorb laser light generated by said semiconductor laser, respectively located on opposite sides of and spaced from said semiconductor ridge by a distance, d, wherein
   said first and second laser light absorbing regions include a semiconductor layer having first and second portions respectively located on opposite sides of and spaced from each other and from said ridge, sandwiching said ridge, and defining respective first and second channels between said first and second portions of said semiconductor layer and said ridge, the first and second channels having a width, Wc, that is larger than d, and an equivalent refractive index, n2, and
   said semiconductor laser oscillates in a fundamental mode, generating laser light having an electric field that extends across each of said first and second channels and that enters and is absorbed in said first and second laser light absorbing regions.

2. The semiconductor laser according to claim 1, wherein the laser light produced by said semiconductor laser has an oscillation wavelength in a range from 601 nm to 700 nm, and the distance d is in a range from 5 μm to 10 μm.

3. The semiconductor laser according to claim 1, wherein the laser light produced by said semiconductor laser has an oscillation wavelength in a range from 701 nm to 900 nm, and the distance d is in a range from 5 μm to 10 μm.

4. The semiconductor laser according to claim 1, wherein the laser light produced by said semiconductor laser has an oscillation wavelength in a range from 330 nm to 600 nm, and the distance d is in a range from 0.7 μm to 5.0 μm.

5. The semiconductor laser according to claim 1, wherein said semiconductor layer has a larger equivalent refractive index than the first and second channels, and
   the first and second channels have widths of at least 10 μm.

6. The semiconductor laser according to claim 1, wherein said first and second laser light absorbing regions are present only in a chip facet portion of said semiconductor laser.

7. The semiconductor laser according to claim 1, wherein said first and second laser light absorbing regions comprise amorphous silicon layers.

8. The semiconductor laser according to claim 1, wherein said first and second laser light absorbing regions are formed by ion implantation.

9. The semiconductor laser according to claim 1, wherein said first and second laser light absorbing regions are formed by Zn diffusion.

* * * * *